(12) United States Patent
Chang et al.

(10) Patent No.: US 11,211,354 B2
(45) Date of Patent: Dec. 28, 2021

(54) SYSTEMS AND METHODS FOR SEMI-FLEXIBLE EUTECTIC BONDER PIECE ARRANEGMENTS

(71) Applicant: Taiwan Semiconductor Manufacturing Co., Ltd., Hsinchu (TW)

(72) Inventors: Chih-Hang Chang, Taoyuan (TW); Richard Huang, Hsinchu (TW); I-shi Wang, Taipei County (TW); Yin-Tun Chou, Hsinchu (TW); Jen-Hao Liu, Miaoli County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 386 days.

(21) Appl. No.: 16/203,366

(22) Filed: Nov. 28, 2018

(65) Prior Publication Data
US 2019/0164929 A1    May 30, 2019

Related U.S. Application Data

(60) Provisional application No. 62/592,177, filed on Nov. 29, 2017.

(51) Int. Cl.
*B23K 37/00* (2006.01)
*H01L 23/00* (2006.01)

(52) U.S. Cl.
CPC .............. *H01L 24/75* (2013.01); *B23K 37/00* (2013.01); *H01L 24/83* (2013.01); *H01L 2224/32225* (2013.01); *H01L 2224/753* (2013.01); *H01L 2224/7555* (2013.01); *H01L 2224/75251* (2013.01); *H01L 2224/75303* (2013.01);
(Continued)

(58) Field of Classification Search
CPC ....... H01L 2924/00013; H01L 2224/94; H01L 2224/7565; H01L 2224/757; H05K 2203/0113; H05K 2203/0338
See application file for complete search history.

(56) References Cited

U.S. PATENT DOCUMENTS

2008/0188069 A1 * 8/2008 Johnson ............... B23K 3/0623
438/613

OTHER PUBLICATIONS

Farrens, S., "Chapter 4—Wafer-Bonding Technologies and Strategies for 3D IC's", Wafer-Level 3D IC's Process Technology, C.S. Tan et al. (eds.), Springer Science+Business Media, LLC, 2008, pp. 49-83. retrieved from http://citeseerx.ist.psu.edu/viewdoc/download?doi=10.1.1.464.8309&rep=rep1&type=pdf.

* cited by examiner

Primary Examiner — Erin B Saad
(74) Attorney, Agent, or Firm — Duane Morris LLP

(57) ABSTRACT

In an embodiment, a system includes: a circular frame comprising a first side and a second side opposite the first side, wherein the circular frame comprises an aperture formed therethrough; an insert disposed within the aperture; a first wafer disposed over the insert; a second wafer disposed over the first wafer, wherein both the first wafer and the second wafer are configured for eutectic bonding when heated; two clamps disposed on the first side along the circular frame, wherein the two clamps are configured to contact the second wafer at respective clamp locations; and a plurality of pieces configured to secure the insert within the aperture, the plurality of pieces comprising both fixed and flexible pieces, the plurality of pieces comprising two fixed pieces disposed respectively adjacent to the clamp locations along the second side of the circular frame.

20 Claims, 7 Drawing Sheets

(52) U.S. Cl.
CPC ............... *H01L 2224/75705* (2013.01); *H01L 2224/75984* (2013.01); *H01L 2224/75987* (2013.01); *H01L 2224/83805* (2013.01); *H01L 2224/94* (2013.01); *H01L 2924/00014* (2013.01)

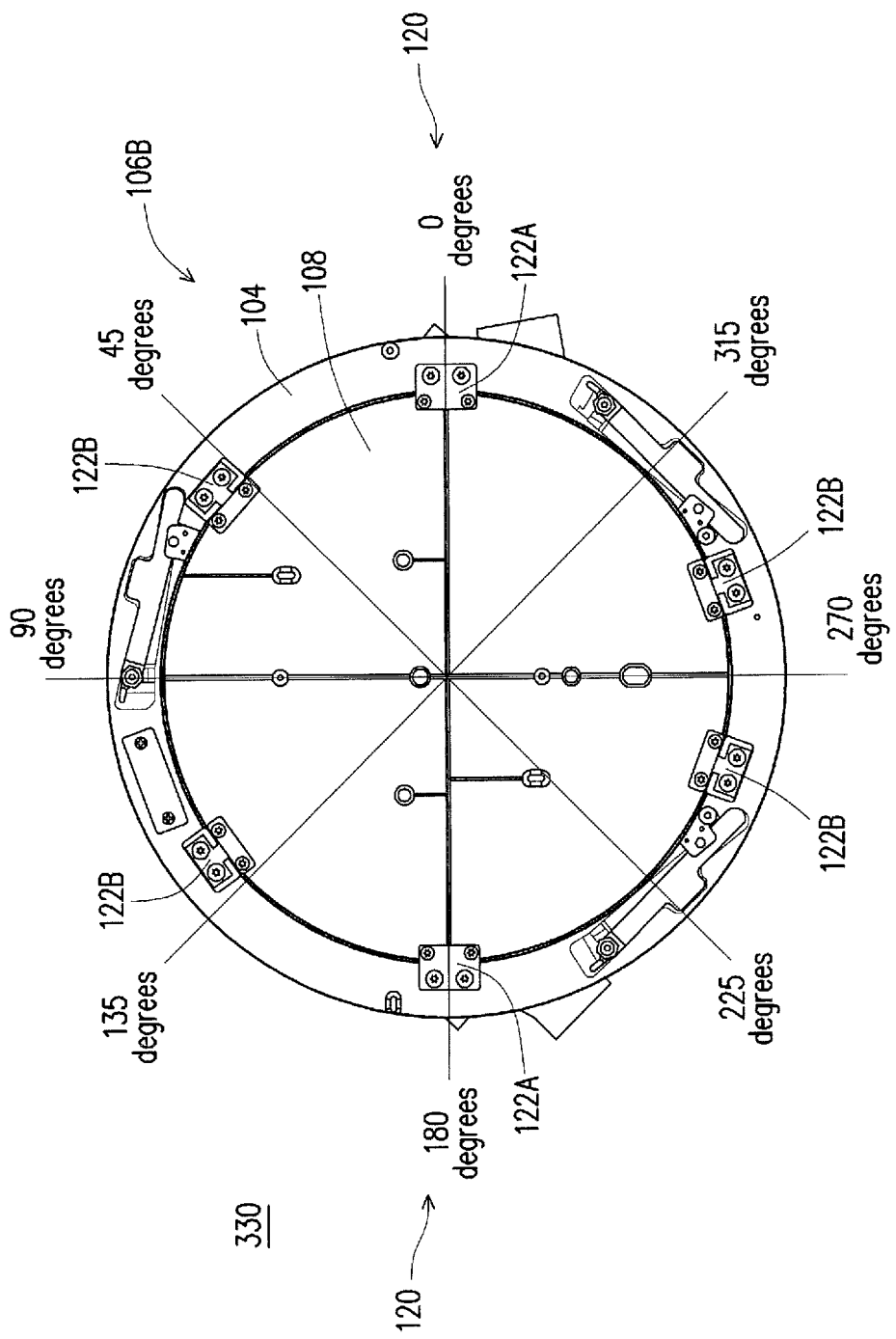

SYSTEMS AND METHODS FOR SEMI-FLEXIBLE EUTECTIC BONDER PIECE ARRANEGMENTS

CROSS-REFERENCE TO RELATED APPLICATION

The present application claims priority to U.S. Provisional Patent Application No. 62/592,177, filed on Nov. 29, 2017, which is incorporated by reference herein in its entirety.

BACKGROUND

In semiconductor technology, products may include devices in which one semiconductor wafer is bonded to another semiconductor wafer. These semiconductor wafers, or more simply referred to as a "wafer", may be bonded using eutectic bonding. Specifically, eutectic bonding may utilize an intermediate metal layer that transforms directly from a solid to a liquid state, or vice versa from a liquid to a solid state, at a specific composition and temperature. A eutectic temperature at which the intermediate metal layer may transform states may be much lower than the melting temperature of the wafers to be bonded.

To facilitate bonding, wafers are typically assembled within a eutectic bonder and heated to the eutectic temperature to facilitate eutectic bonding between the wafers. However, during heating, the wafers may become offset due to thermal expansion or the parts of a eutectic bonder may warp due to the heat treatment applied to the eutectic bonder. Therefore, traditional bonding techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 3C is a bottom view schematic diagram of a eutectic bonder with another alternate semi-flexible eutectic bonder piece arrangement, in accordance with some embodiments.

DETAILED DESCRIPTION OF EXEMPLARY EMBODIMENTS

Figure 1:
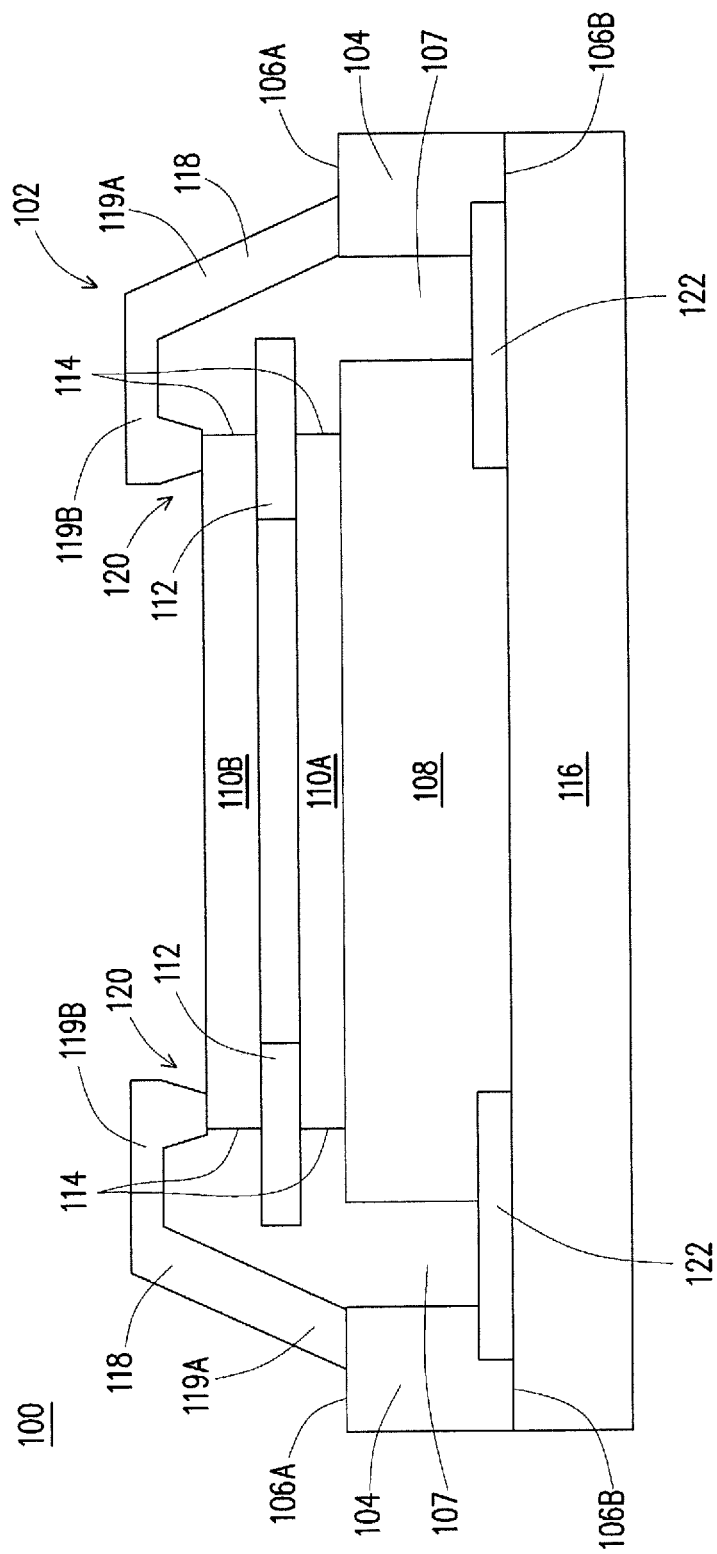
FIG. 1 is a side cross-sectional schematic diagram of eutectic bonder with a semi-flexible eutectic bonder piece arrangement, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of semi-flexible eutectic bonder piece arrangements. Eutectic bonders may include an insert (e.g., a platform) on which wafers are secured via a clamp disposed on a circular frame surrounding the insert. The clamp may be located on a first side (e.g., top side) of the circular frame at a clamp location. The clamp location may be an angular or other designation of location along the circumference of an aperture of the circular frame centered at a point of contact between the clamp and a topmost wafer. The insert may also be secured relative to the frame via bonder pieces (also termed more simply as a "piece") disposed on a part of the circular frame opposite the clamp (e.g., a back side of the circular frame, or a second side of the circular frame opposite the first side). Traditionally, bonder pieces of a eutectic bonder are either all fixed (e.g., inflexible) or flexible (e.g., movable). However, bonder pieces that are all fixed may cause the eutectic bonder (e.g., the insert) to warp during the process of heating during eutectic bonding, due to thermal expansion. Also, bonder pieces that are all flexible (e.g., movable) may cause the secured wafers to shift during the process of heating during eutectic bonding, due to thermal expansion. Furthermore, although both flexible and fixed bonder pieces may be utilized, the above referenced defects may still be present based on the particular number and orientation of the bonder pieces. Accordingly, semi-flexible eutectic bonder piece arrangements may be utilized which include fixed bonder pieces at a position or location near the clamp location, and flexible bonder pieces at other locations. For example, the fixed bonder pieces (also termed as fixed pieces) may be adjacent to the clamp location along the second side of the circular clamp. As examples of being adjacent, the fixed bonder pieces may be substantially at or next to the clamp location or within 45 degrees or less of the clam location on the second side of the circular clamp. Also, flexible bonder pieces (also termed as flexible pieces) may be farther away from the clamp location, or more than 45 degrees of the clamp location on the second side of the circular clamp.

FIG. 1 is a side cross-sectional schematic diagram 100 of eutectic bonder 102 with a semi-flexible eutectic bonder piece arrangement, in accordance with some embodiments. The eutectic bonder 102 includes a circular frame 104 comprising a first side 106A and a second side 106B opposite the first side. As will be more clearly illustrated in the following figures, the circular frame 104 may comprise an aperture 107 that is formed therethrough. The circular frame 104 may be circular in that the circular frame 104 is shaped with a circle (e.g., a circular aperture 107) or may accommodate a circular shape within the aperture 107. The insert 108 may be disposed within the aperture 107. The insert 108 may be configured to support the wafers 110A, 110B for eutectic bonding. For example, the insert 108 may support a first wafer 110A over the insert 108. Stated another way, the first wafer 110A may be on the insert 108. Also, a second wafer 110B may be over the first wafer 110A. The first wafer 110A and second wafer 110B may be separated by flags 112 proximate to and abutting the extremities 114 of the first and second wafers 110A, 110B to separate the wafers 110A, 110B prior to bonding. As discussed above, bonding may be performed by heating the eutectic bonder 102 at least to a eutectic temperature using a heater 116. The heater 116 may face the second side 106B. In this manner, an intermediate metal layer between the first and second wafers 110A, 110B may be transformed (e.g., melt or liquify) to form a bond that, when cooled, may bond the first and second wafers 110A, 110B. Two clamps 118 may be disposed on the first side of the circular frame 104. The two clamps 118 may contact the wafer 110B at clamp locations 180 degrees apart from another. Stated another way, the clamp locations 120 may be the location at which a clamp 118 contacts the second wafer 110B. Also, as illustrated, the clamps may include a first member 119A that extends from the circular frame 104 and a second member 119B connected with the first member 119A. In certain embodiments, the first member 119A and second member 119B may be connected via a joint. Also, the second member 119B may be configured to contact a the second wafer 110B. Accordingly, the two clamps 118 may be configured to secure the first and second wafers 110A, 110B on the insert 108. Also, there may be a plurality of bonder pieces 122 configured to secure the insert 108 within the aperture 107. The plurality of bonder pieces 122 may include both fixed and flexible pieces, as will be discussed further below. In various embodiments, the plurality of bonder pieces 122 may include at least two fixed pieces disposed respectively adjacent to the clamp locations along the second side of the circular frame 104.

In certain embodiments, a location may refer to a very center point or bisecting line of a footprint. For example, a clamp location may be the very center point of a footprint of contact between a clamp and a wafer. As another example, a clamp location may be a bisecting line of a footprint of contact between a clamp and a wafer that also passes through the center point (e.g., axis) or pole of the eutectic bonder and/or insert. For example, the clamp location may be expressed in angular coordinates, polar angles, or azimuths (and, optionally, radial coordinates or radiuses from the pole). In particular embodiments, the clamp location may only refer to angular coordinates, polar angles, or azimuths. This may be because clamp locations are set to abut both the insert 108 and circular frame 104, and thus have a set, known, or predetermined distance (e.g., radius) away from the center point or pole of the eutectic bonder and/or insert. Accordingly, a relative location of bonder pieces relative to the clamp location may refer to a bonder piece angular coordinates, polar angles, or azimuths relative to the clamp location angular coordinates, polar angles, or azimuths. Stated another way, both clamp locations and bonder piece locations may be expressed as angles reflective of angular coordinates, polar angles, or azimuths.

Figure 2:
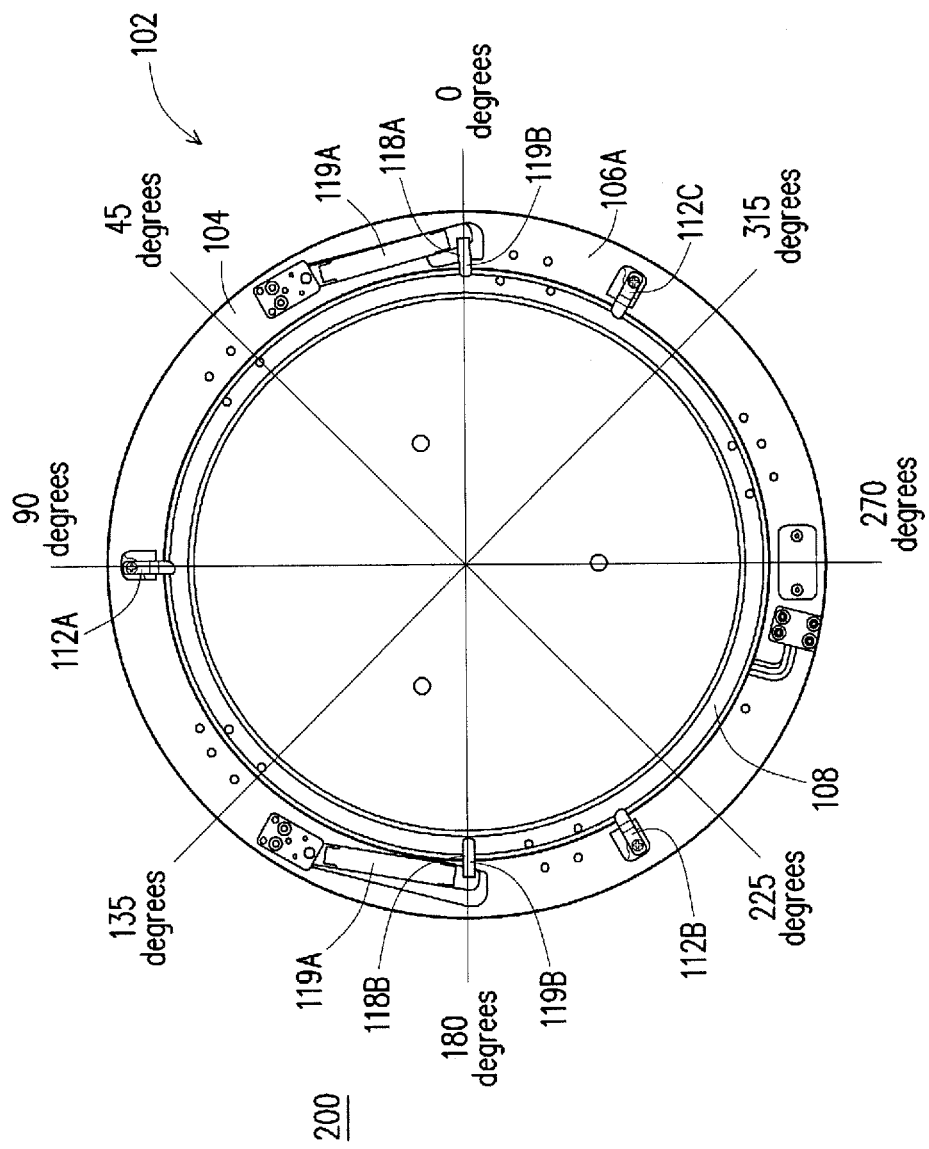
FIG. 2 is a top view schematic diagram of a eutectic bonder with a semi-flexible eutectic bonder piece arrangement, in accordance with some embodiments.

FIG. 2 is a top view schematic diagram 200 of the eutectic bonder 102 with a semi-flexible eutectic bonder piece arrangement, in accordance with some embodiments. The diagram 200 illustrates the first side 106A (e.g., top side) of the circular frame 104. The circular frame 104 is of a circular shape and includes an aperture within which the insert 108 is disposed. Also, two clamps 118 may be configured to contact a wafer at clamp locations 180 degrees from each other (e.g., as left and right clamp locations). The clamps may each include the first member 119A and the second member 119B. With respect to the clamps 118, the respective clamp locations 120 may be centered at zero degrees for the right clamp 118A and at 180 degrees for the left clamp 118B. Also, the flags 112 may be located at 90 degrees for a center flag 112A, 215 degrees for a left flag 112B, and 325 degrees for a right flag 112C.

Figure 3A:
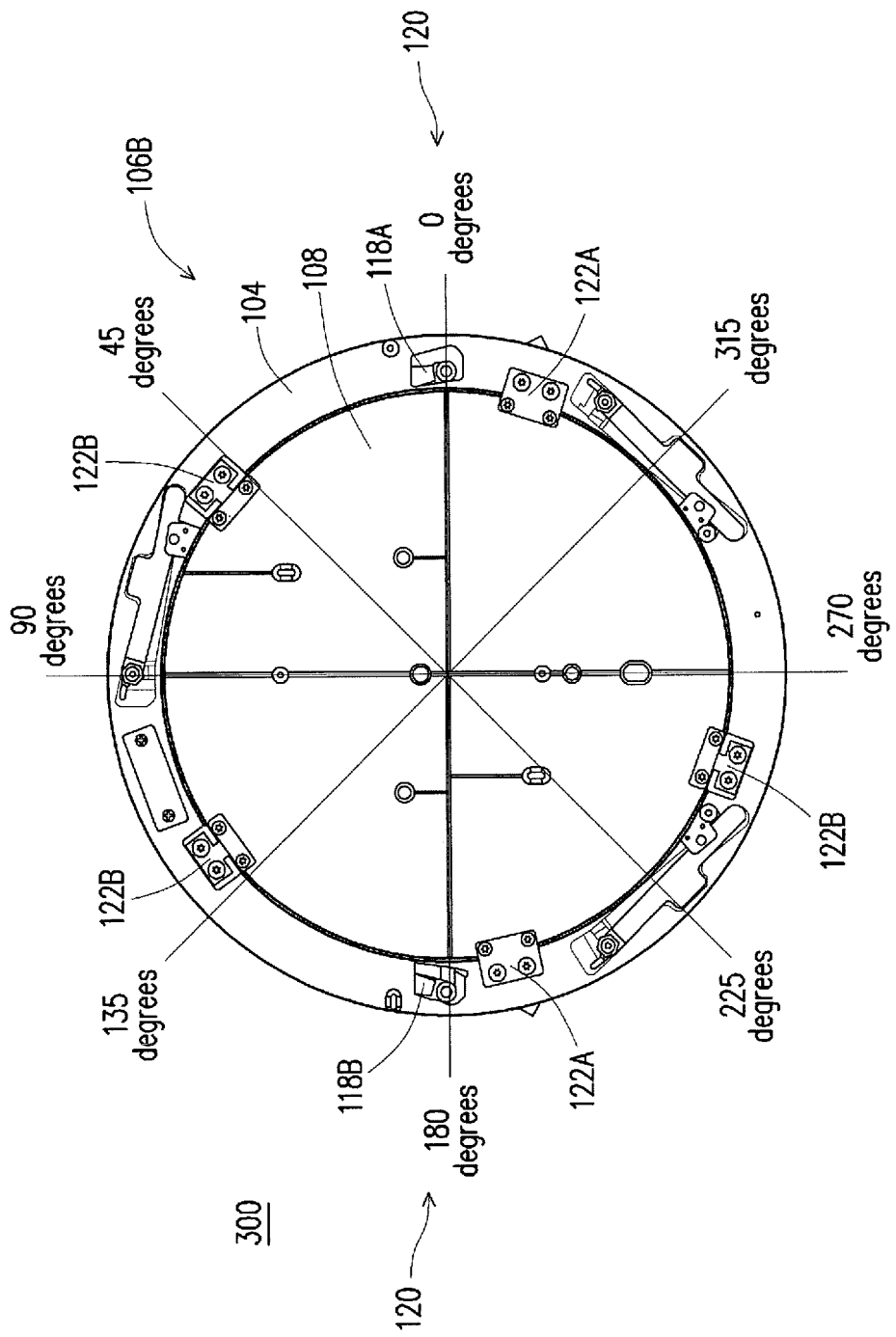
FIG. 3A is a bottom view schematic diagram of a eutectic bonder with an semi-flexible eutectic bonder piece arrangement, in accordance with some embodiments.

FIG. 3A is a bottom view schematic diagram 300 of the eutectic bonder 102 with an semi-flexible eutectic bonder piece arrangement, in accordance with some embodiments. The diagram 300 illustrates the second side 106B (e.g., bottom side) of the circular frame 104. The circular frame 104 is of a circular shape and includes an aperture within which the insert 108 is disposed. Also, as can be seen in open portions along the circular frame, the two clamps are disposed 180 degrees from each other, as the left clamp 118B and the right clamp 118A. Accordingly, the respective clamp locations 120 may be centered at zero degrees for the right clamp 118A and at 180 degrees for the left clamp 118B.

A plurality of bonder pieces 122 may be disposed along the second side 106B of the circular frame 104. These bonder pieces 122 may be configured to secure the insert within the aperture. The plurality of bonder pieces 122 may include both fixed pieces 122A and flexible pieces 122B. Specifically, the plurality of bonder pieces 122 may include two fixed pieces 122A disposed respectively adjacent to the clamp locations 120 along the second side 106B of the circular frame 104. Stated another way, the two fixed pieces 122A may be at substantially 194 degrees and 344 degrees, which is within 45 degrees of either one of the clamp locations (e.g., 0 degrees or 180 degrees). Also, the flexible pieces 122B may be at other locations not adjacent to the clamp locations 120. As examples of being adjacent, the fixed pieces 122A may be substantially at the clamp location 120 or within 45 degrees or less of the clam location 120 on the second side 106B of the circular frame 104. Also, flexible pieces 122A may be farther away from the clamp location 120, or be more than 45 degrees of the clamp location 120 on the second side 106B of the circular frame 104.

Figure 3B:
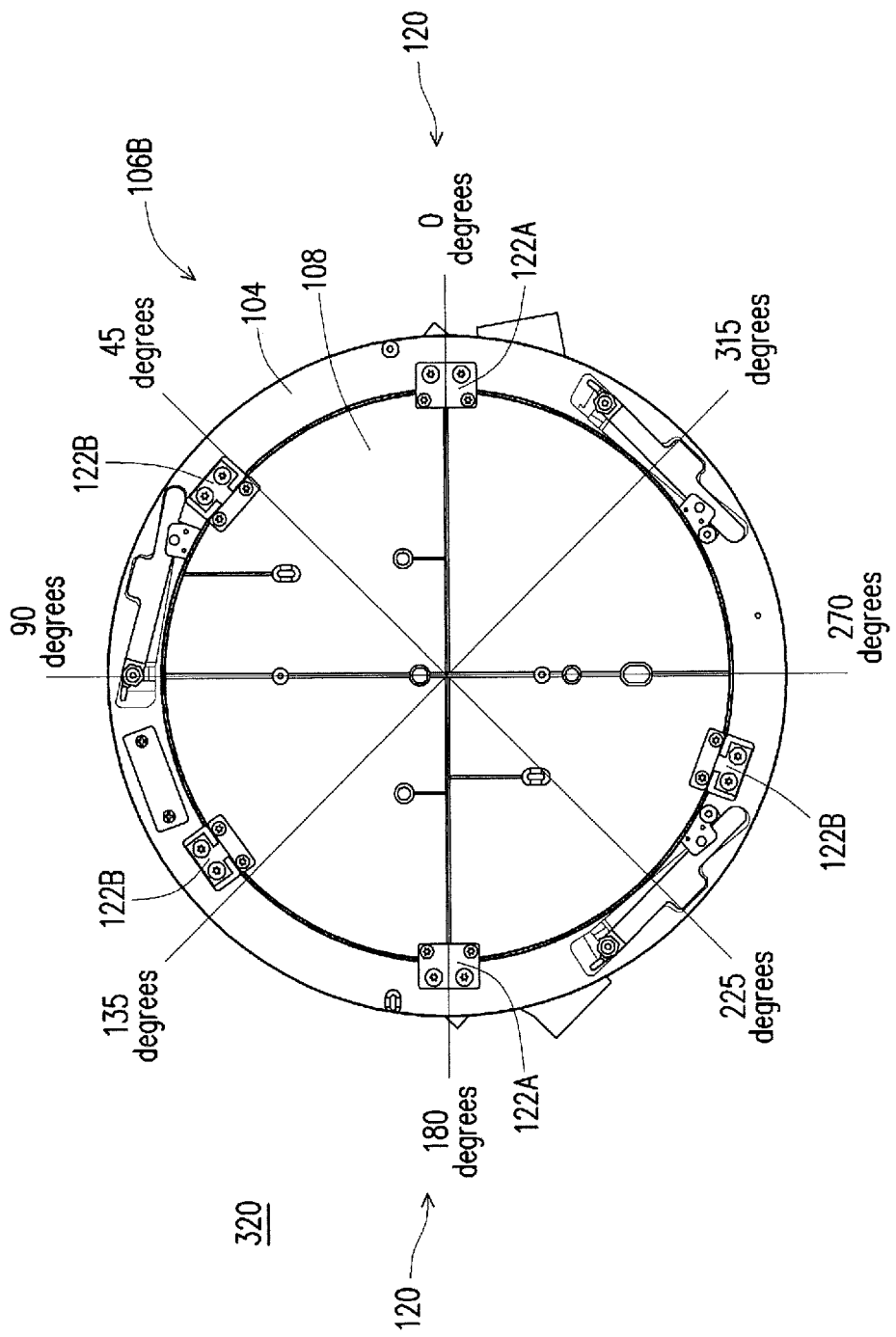
FIG. 3B is a bottom view schematic diagram of a eutectic bonder with an alternate semi-flexible eutectic bonder piece arrangement, in accordance with some embodiments.

FIG. 3B is a bottom view schematic diagram 320 of the eutectic bonder 102 with an alternate semi-flexible eutectic bonder piece arrangement, in accordance with some embodiments. The diagram 320 is functionally the same as the diagram 300 of FIG. 3A except that the arrangement of the plurality of bonder pieces 122A, 122B are different. Specifically, returning to FIG. 3B, the fixed pieces 122A are at the clamp locations (e.g., at 0 and 180 degrees).

FIG. 3C is a bottom view schematic diagram 330 of the eutectic bonder 102 with another alternate semi-flexible eutectic bonder piece arrangement, in accordance with some embodiments. The diagram 330 is functionally the same as the diagram 300 of FIG. 3A except that the arrangement of the plurality of bonder pieces 122 are different. Specifically, returning to FIG. 3C, the fixed bonder pieces 122A are at the clamp locations (e.g., at 0 and 180 degrees) and the arrangement of plurality of bonder pieces 122A, 122B across the left and right sides are mirrored. For example, the arrangement of the plurality of bonder pieces 122A, 122B across either side of 90 to 270 degrees are mirror images.

Figure 4A:
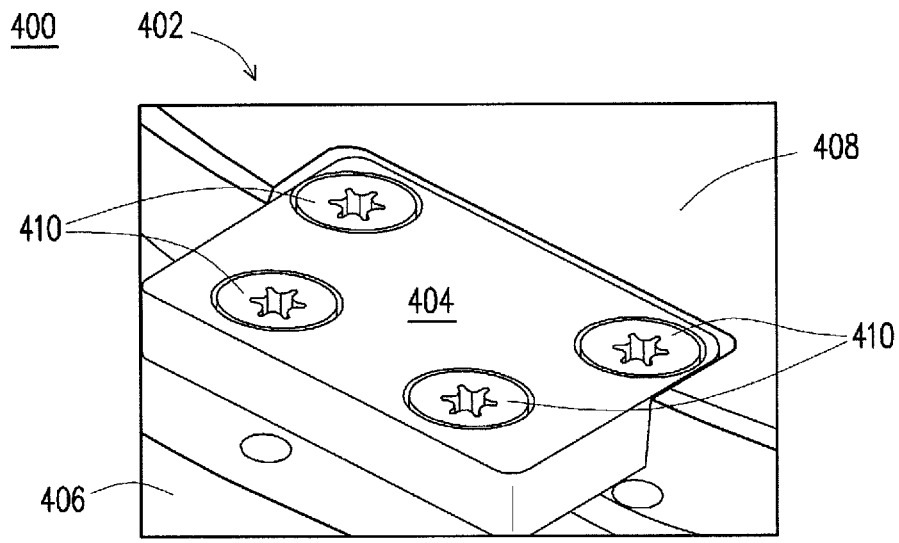
FIG. 4A is a perspective view diagram of a fixed piece, in accordance with some embodiments.

FIG. 4A is a perspective view diagram 400 of a fixed piece 402, in accordance with some embodiments. The fixed piece includes a rigid material 404 secured to both a circular frame 406 and an insert 408. The rigid material 404 may bridge the circular frame 406 and insert 408 in that the single rigid material 404 may be continuous from abutting against the circular frame 406 to abutting against the insert 408. The rigid material 404 may be secured to the circular frame 406 and the insert 408 via bolts, screws, welding or other types of conventional securement structures 410. The rigid material 404 may be substantially inflexible. In particular embodiments, the material may be, for example, steel, aluminum, or ceramic. Also, in certain embodiments, the rigid materteral 404 may be substantially a single material or a single component (e.g., not made of multiple components put together). Accordingly, the fixed piece may rigidly secure the circular frame to the insert.

Figure 4B:
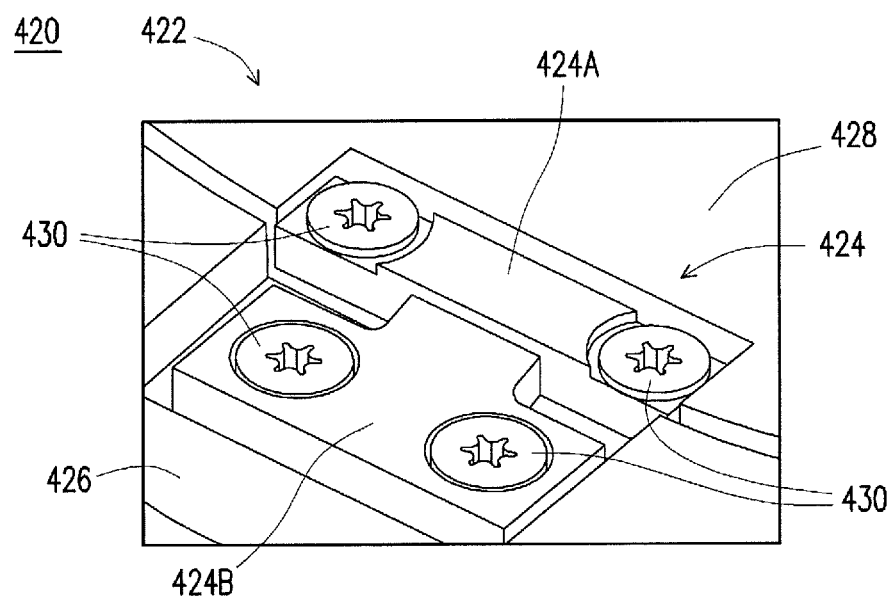
FIG. 4B is a perspective view diagram of a flexible piece, in accordance with some embodiments.

FIG. 4B is a perspective view diagram 420 of a flexible piece 422, in accordance with some embodiments. In contrast with the fixed piece 402 of FIG. 4A which is formed of a substantially single material or a single component, the flexible piece 422 of FIG. 4B may be formed of substantially multiple materials or multiple components. For example, the flexible piece 422 may include interlocking parts 424 that interlock with each other and that are secured respectively to either the circular frame 426 or the insert 428. These interlocking parts 424 may include a concavity part 424A that includes a concavity and an extension part 424B that includes an extension. The extension part 424B may be configured to at least partially enter the concavity of the concavity part 424A. The extension part 424B may be secured to the circular frame 426. Neither of the interlocking parts 424, in itself, may bridge the circular frame 426 and insert 428 in that no single interlocking part 424 may be continuous from abutting against the circular frame 426 to abutting against the insert 428. In particular embodiments, the material of each individual interlocking part 424 may be, for example, steel, aluminum, or ceramic. The securement may utilize, for example, bolts, screws, welding or other types of conventional securement structures 410. Also, the concavity part 424A may be secured to the insert 428. The securement may utilize bolts, screws, welding or other types of conventional securement structures 410. The cross section of the concavity may be slightly larger than the cross section of the extension configured to be inserted into the cavity. Accordingly, the flexible piece 422 may flexibly secure the insert 428 to the circular frame 426 with an amount of give based on how much larger the cavity is than the extension configured to be inserted into the cavity.

Figure 5:
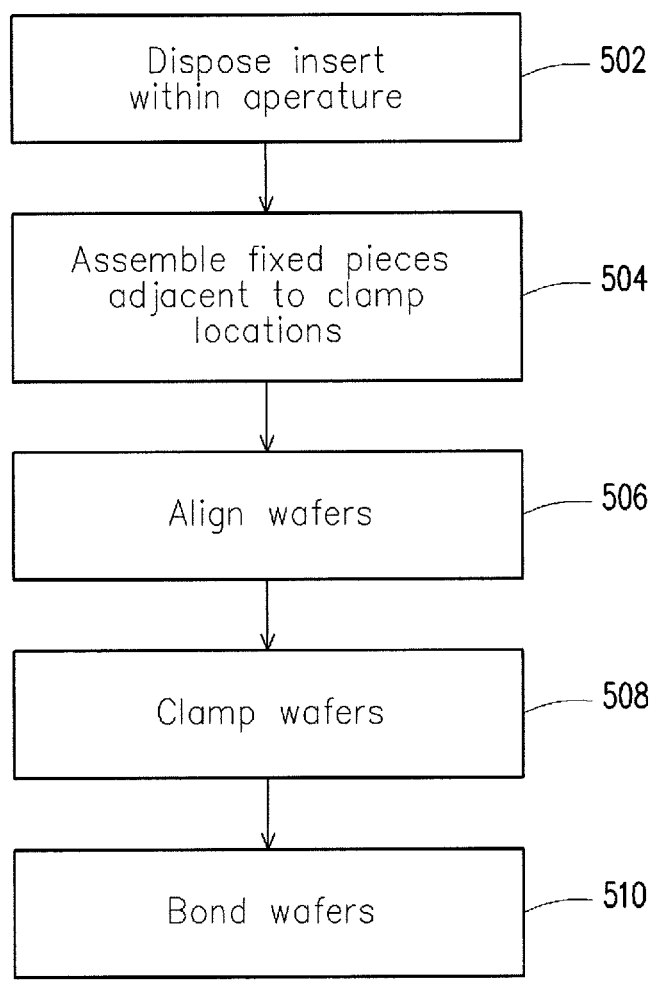
FIG. 5 is a flow chart of a eutectic bonding process, in accordance with some embodiments.

FIG. 5 is a flow chart of a eutectic bonding process, in accordance with some embodiments. It is noted that the process 5500 is merely an example, and is not intended to limit the present disclosure. Accordingly, it is understood that additional operations may be provided before, during, and after the process 5500 of FIG. 5, certain operations may be omitted, certain operations may be performed concurrently with other operations, and that some other operations may only be briefly described herein.

At operation 502, an insert is disposed within an aperture surrounded by a circular frame. The insert may be within the aperture such that it may be secured within the aperture and relative to the circular frame.

At operation 504, fixed pieces may be assembled adjacent to clamp locations. These fixed pieces may be utilized to secure the insert within the aperture. For example, by being adjacent, these fixed pieces may be placed at fixed piece locations that are at the clamp locations, or within 45 degrees of a clamp location. These fixed pieces may be made of, and connect the circular frame and insert via a substantially single rigid component. Accordingly, fixed pieces may contrast with flexible pieces which are made of, and connect, the circular frame and insert via multiple components (e.g., an extension part and a concave part, as discussed above). Flexible pieces may be placed, or located, so as to be non-adjacent to the clamp locations, or more than 45 degrees of a clamp location. In certain embodiments, the fixed piece locations may be at adjacent positions that are smaller than 45 degrees of a clamp location, such as at 5, 10, 15, 20, 25, 30, 35, or 40 degrees of a clamp location. The value range that defines an adjacent position may be termed as a fixed piece value range. The fixed piece value range may be inversely related to the number of clamp locations, such that the fixed piece value range may decrease with an increase in clamp locations within a eutectic bonder. For example, when there are three clamp locations, the fixed piece range may be 20 degrees. Stated another way, when there are three clamp locations, an adjacent position for a fixed piece location may be within 20 degrees of a clamp location (as opposed to say 45 degrees in embodiments with two clamp locations). Also, as discussed above, fixed pieces and/or flexible pieces may be secured to the circular frame or the insert via bolts, screws, welding or other types of conventional securement structures.

At operation 506, the wafers may be aligned on the insert. The wafers may be aligned in a manner suitable for eutectic bonding. For example, the wafers may be aligned so that wafers are both centered at a same point (e.g., at a same center point or a pole of the eutectic bonder). As another example, the wafers may be aligned so that parts of the wafers may be in selective conductive communication after eutectic bonding. As noted above, flags may be utilized to separate the aligned wafers.

At operation 508, the wafers may be clamped onto the insert. By clamping the wafers onto the insert, the insert may be secured from a first side or a top side via the clamp. Also, the insert may have already been secured along the second side or a bottom side via the bonder pieces. Also, as discussed above, the positions (e.g., angular positions) at which the clamps contact the wafer may be the clamp location. In certain embodiments, the clamp locations are 180 degrees from each other.

At operation 510, wafers may be bonded together in a eutectic manner. For example, the insert may be disposed above a heater which may be configured to heat a eutectic bonder deployed with wafers for bonding. By heating the eutectic bonder, the wafers may be heated to a eutectic temperature that may cause the wafers to be bonded in a eutectic manner. Specifically, an intermediate metal layer between the wafers may be transformed at the eutectic temperature to melt and connect the wafers. Then, when cooled from the eutectic temperature, the wafers may be bonded together.

In an embodiment, a system includes: a circular frame comprising a first side and a second side opposite the first side, wherein the circular frame comprises an aperture formed therethrough; an insert disposed within the aperture; a first wafer disposed over the insert; a second wafer disposed over the first wafer, wherein both the first wafer and the second wafer are configured for eutectic bonding when heated; two clamps disposed on the first side along the circular frame, wherein the two clamps are configured to contact the second wafer at respective clamp locations; and a plurality of pieces configured to secure the insert within the aperture, the plurality of pieces comprising both fixed and flexible pieces, the plurality of pieces comprising two fixed pieces disposed respectively adjacent to the clamp locations along the second side of the circular frame.

In another embodiment, a system includes: a frame comprising a first side and a second side opposite the first side, wherein the frame comprises an aperture formed therethrough; an insert disposed within the aperture, the insert configured to support eutectic bonding of wafers when heated; two clamps disposed on the first side, wherein the two clamps are configured to secure the wafers at respective clamp locations; and a plurality of both fixed pieces and flexible pieces configured to secure the insert within the aperture, wherein the plurality of both fixed pieces and flexible pieces comprises two fixed pieces that are disposed respectively adjacent to the clamp locations along the second side of the frame.

In another embodiment, a method includes: providing a first wafer and a second wafer; securing the first wafer and the second wafer to an insert at clamp locations using two clamps disposed on a first side of a circular frame, wherein the circular frame defines an aperture; and securing the insert within the aperture using a plurality of both fixed pieces and flexible pieces, wherein the plurality of both fixed pieces and flexible pieces comprises two fixed pieces that are disposed respectively adjacent to the clamp locations along a second side of the circular frame.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a circular frame comprising a first side and a second side opposite the first side, wherein the circular frame comprises an aperture formed therethrough;
an insert disposed within the aperture;
a first wafer disposed over the insert;
a second wafer disposed over the first wafer, wherein both the first wafer and the second wafer are configured for eutectic bonding when heated;
two clamps disposed on the first side along the circular frame, wherein the two clamps are configured to contact the second wafer at respective clamp locations; and
a plurality of pieces configured to secure the insert within the aperture, the plurality of pieces comprising both fixed and flexible pieces, wherein the fixed pieces are more rigid than the flexible pieces, the plurality of pieces comprising two fixed pieces disposed respectively adjacent to the clamp locations along the second side of the circular frame,
where the two fixed pieces are bolted to both the circular frame and the insert.

2. The system of claim 1, wherein the plurality of pieces comprises more flexible pieces than fixed pieces.

3. The system of claim 1, wherein the two fixed pieces are within 45 degrees of the clamp locations.

4. The system of claim 1, wherein the first wafer and the second wafer are separated by a flag abutting extremities of the first wafer and the second wafer.

5. The system of claim 1, wherein the clamp locations are 180 degrees apart from each other.

6. The system of claim 1, wherein the two fixed pieces are 180 degrees apart from each other.

7. The system of claim 1, wherein the flexible pieces are each bolted to both the circular frame and the insert.

8. The system of claim 1, wherein the second side of the circular frame faces a heater configured to heat the first wafer and the second wafer for the eutectic bonding.

9. A system, comprising:
a frame comprising a first side and a second side opposite the first side, wherein the frame comprises an aperture formed therethrough;
an insert disposed within the aperture, the insert configured to support eutectic bonding of wafers when heated;
two clamps disposed on the first side, wherein the two clamps are configured to secure the wafers at respective clamp locations; and
a plurality of both fixed pieces and flexible pieces configured to secure the insert within the aperture, wherein the fixed pieces are more rigid than the flexible pieces, wherein the plurality of both fixed pieces and flexible pieces comprises two fixed pieces that are disposed respectively adjacent to the clamp locations along the second side of the frame,
where the two fixed pieces are bolted to both the circular frame and the insert.

10. The system of claim 9, wherein the plurality of both fixed pieces and flexible pieces comprises more flexible pieces than fixed pieces.

11. The system of claim 9, wherein the two fixed pieces are within 45 degrees of the clamp locations.

12. The system of claim 9, wherein the wafers comprise a first wafer and a second wafer that are separated by a flag abutting extremities of the first wafer and the second wafer.

13. The system of claim 9, wherein the two fixed pieces are about 180 degrees apart from each other.

14. A system, comprising:
- a circular frame comprising a first side and a second side opposite the first side, wherein the circular frame comprises an aperture formed therethrough;
- an insert disposed within the aperture;
- a first wafer disposed over the insert;
- a second wafer disposed over the first wafer, wherein both the first wafer and the second wafer are configured for eutectic bonding when heated;
- two clamps disposed on the first side along the circular frame, wherein the two clamps are configured to contact the second wafer at respective clamp locations; and
- a plurality of pieces configured to secure the insert within the aperture, the plurality of pieces comprising both fixed and flexible pieces, the plurality of pieces comprising two fixed pieces disposed respectively adjacent to the clamp locations along the second side of the circular frame,
- wherein the flexible pieces are each bolted to both the circular frame and the insert.

15. The system of claim 14, wherein the plurality of pieces comprises more flexible pieces than fixed pieces.

16. The system of claim 14, wherein the two fixed pieces are within 45 degrees of the clamp locations.

17. The system of claim 14, wherein the first wafer and the second wafer are separated by a flag abutting extremities of the first wafer and the second wafer.

18. The system of claim 14, wherein the clamp locations are 180 degrees apart from each other.

19. The system of claim 14, wherein the two fixed pieces are 180 degrees apart from each other.

20. The system of claim 14, where the two fixed pieces are bolted to both the circular frame and the insert.

* * * * *